(12) United States Patent
Hofmann et al.

(10) Patent No.: US 7,208,794 B2
(45) Date of Patent: Apr. 24, 2007

(54) HIGH-DENSITY NROM-FINFET

(75) Inventors: Franz Hofmann, Munich (DE);
Erhard Landgraf, Munich (DE);
Richard Johannes Luyken, Munich
(DE); Wolfgang Roesner, Ottobrunn
(DE); Michael Specht, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/073,017

(22) Filed: Mar. 4, 2005

(65) Prior Publication Data

US 2005/0186738 A1    Aug. 25, 2005

Related U.S. Application Data

(63) Continuation of application No. PCT/EP03/09297, filed on Aug. 21, 2003.

(30) Foreign Application Priority Data

Sep. 5, 2002  (DE)  ............................. 102 41 170

(51) Int. Cl.
H01L 29/76    (2006.01)
H01L 29/788   (2006.01)
H01L 29/792   (2006.01)
H01L 29/94    (2006.01)
H01L 31/119   (2006.01)

(52) U.S. Cl. ................. 257/314; 257/288; 257/296; 257/297; 257/298; 257/299; 257/315; 257/316; 257/317; 257/318; 257/319; 257/320; 257/321; 257/322; 257/323; 257/324; 257/325; 257/326; 257/331; 257/401; 257/619; 257/903; 257/904; 257/905

(58) Field of Classification Search .............. 257/331, 257/401, 619, 288, 296, 297–299, 314–326, 257/903–905
See application file for complete search history.

(56) References Cited

U.S. PATENT DOCUMENTS

| 5,155,057 A | * | 10/1992 | Dennison et al. | ........... 438/254 |
| 5,236,860 A | * | 8/1993 | Fazan et al. | ............... 438/256 |
| 5,411,905 A |  | 5/1995 | Acovic et al. | |

(Continued)

FOREIGN PATENT DOCUMENTS

DE    198 23 733 A1    12/1999

OTHER PUBLICATIONS

Patent Abstracts of Japan, vol. 018, No. 174, Mar. 24, 1994 & JP 05 343581 A (Kawasaki Steel Corp.), Dec. 24, 1993.

(Continued)

*Primary Examiner*—Ida M. Soward
(74) *Attorney, Agent, or Firm*—Dickstein Shapiro LLP

(57) ABSTRACT

Semiconductor memory having memory cells, each including first and second conductively-doped contact regions and a channel region arranged between the latter, formed in a web-like rib made of semiconductor material and arranged one behind the other in this sequence in the longitudinal direction of the rib. The rib has an essentially rectangular shape with an upper side of the rib and rib side faces lying opposite. A memory layer is configured for programming the memory cell, arranged on the upper side of the rib spaced apart by a first insulator layer, and projects in the normal direction of the one rib side face over one of the rib side faces so that the one rib side face and the upper side of the rib form an edge for injecting charge carriers from the channel region into the memory layer. A gate electrode is spaced apart from the one rib side face by a second insulator layer and from the memory layer by a third insulator layer, electrically insulated from the channel region, and configured to control its electrical conductivity.

19 Claims, 7 Drawing Sheets

U.S. PATENT DOCUMENTS

| | | | |
|---|---|---|---|
| 5,648,291 A * | 7/1997 | Sung | 438/396 |
| 5,691,552 A | 11/1997 | Oyama | |
| 5,736,442 A * | 4/1998 | Mori | 438/257 |
| 5,796,141 A | 8/1998 | Lin et al. | |
| 5,834,806 A | 11/1998 | Lin et al. | |
| 5,874,759 A * | 2/1999 | Park | 257/314 |
| 6,288,431 B1 | 9/2001 | Iwasa et al. | |
| 6,413,802 B1 * | 7/2002 | Hu et al. | 438/151 |
| 6,445,029 B1 | 9/2002 | Lam et al. | |
| 6,624,465 B1 * | 9/2003 | Chien et al. | 257/315 |
| 6,734,066 B2 * | 5/2004 | Lin et al. | 438/259 |
| 6,770,516 B2 * | 8/2004 | Wu et al. | 438/154 |
| 6,800,905 B2 * | 10/2004 | Fried et al. | 257/351 |
| 6,984,557 B2 * | 1/2006 | Van Schaijk | 438/257 |
| 2003/0038318 A1 * | 2/2003 | Forbes | 257/331 |
| 2003/0151077 A1 * | 8/2003 | Mathew et al. | 257/250 |
| 2003/0178670 A1 * | 9/2003 | Fried et al. | 257/315 |
| 2004/0036118 A1 * | 2/2004 | Abadeer et al. | 257/347 |

OTHER PUBLICATIONS

Patent Abstracts of Japan, vol. 2000, No. 26, Jul. 1, 2002 & JP 2001 244351 A (Sharp Corp.), Sep. 7, 2001.

* cited by examiner

HIGH-DENSITY NROM-FINFET

CROSS REFERENCE TO RELATED APPLICATION

The present application is a continuation of International Patent Application Serial No. PCT/EP2003/009297, filed Aug. 21, 2003, and claims benefit of German Application No. 102 41 170.0, filed Sep. 5, 2002 which is incorporated by reference herein. The International Application was published in German on Mar. 18, 2004 as WO 2004/023519 under PCT Article 21(2).

TECHNICAL FIELD

The present invention relates to a semiconductor memory and in particular to a memory which requires relatively low programming voltages and permits a high-density memory cell array.

BACKGROUND

Conventional nonvolatile semiconductor memory elements are available, depending on the application, in a plurality of different designs, for example PROM, EPROM, EEPROM, FLASH EEPROM, SONOS, etc. These different designs differ in particular in the erasure option, programmability and programming time, retention time, memory density and their manufacturing costs. There is a particular need for high-density and economical flash semiconductor memories. Known designs are, in particular, what are referred to as NAND and ETOX memory cells whose memory density however requires more than $4F^2$, F being the smallest structural dimension of the semiconductor memories occurring in the process. In the publication by B. Eitan et al. "NROM: A novel localized trapping, 2-bit nonvolatile Memory Cell", IEEE Electron Device Letters vol. 21, No 11, November 2000, what is referred to as an NROM memory is described, which, by using a 2-bit cell, makes possible a memory cell with a $2F^2$ surface density.

However, all the nonvolatile memory elements mentioned above require comparatively high voltages of at least 10 V for programming or erasing the bits stored in a memory layer. For example, an NROM memory cell has to function with gate voltages in the region of 9 V. Since external voltages of 10 V or more are not available in the typical fields of application of flash memory elements, such voltages must be generated "on-chip". Although the charge pumps necessary for this are generally known, they require a considerable amount of surface area on the memory chip, thus reducing its degree of integration and consequently disadvantageously increasing the manufacturing costs.

There is a perceived need for a semiconductor memory having a plurality of memory cells which requires, in particular, relatively low programming voltages and permits a high-density memory cell array.

SUMMARY

In one aspect, the present invention is directed to a semiconductor memory having a plurality of memory cells, as well as to a method for manufacturing a semiconductor memory.

According to one embodiment of the invention, a semiconductor memory includes a plurality of memory cells, with each memory cell including a first conductively doped contact region, a second conductively doped contact region and a channel region which is arranged between the latter. These regions are formed in a web-like rib made of semiconductor material, and are arranged one behind the other in this sequence in the longitudinal direction of the rib, wherein the rib has, at least in a section in the channel region running perpendicularly with respect to the longitudinal direction of the rib, an essentially rectangular shape with an upper side of the rib and rib side faces lying opposite.

The memory also includes a memory layer which is configured for programming the memory cell and is arranged on the upper side of the rib spaced apart by a first insulator layer. The memory layer projects in the normal direction of the one rib side face over at least one of the rib side faces so that the one rib side face and the upper side of the rib form an injection edge for injecting charge carriers from the channel region into the memory layer. The memory further includes at least one gate electrode which is spaced apart from the one rib side face by a second insulator layer, and from the memory layer by a third insulator layer, wherein the gate electrode is electrically insulated from the channel region and is configured to control its electrical conductivity.

The semiconductor memory itself is a nonvolatile semiconductor memory which is electrically erasable (EEPROM), in particular a FLASH semiconductor memory. An item of binary information, i.e. a "bit", is stored in a known fashion using a memory layer which is configured for programming the memory cell. This memory layer is designed for capturing charge carriers from, and emitting them into, the channel region of the transistor which extends in the longitudinal direction of the rib between two doped contact regions (source and drain regions of the transistor). The transistor layout is thus similar to that of what is referred to as a FINFET. The memory layer is electrically insulated from the doped contact regions and the gate electrode of the transistor.

Electrons which are captured in the memory layer bring about, by means of the field effect, in a known fashion, a displacement of the characteristic curve of the transistor, in particular of its threshold voltage. Given a predetermined gate voltage and a predetermined source-drain voltage, it is thus possible to detect, by means of the electrical conductivity of the transistor channel, whether or not charge carriers are captured in the memory layer.

In order to "program" the memory layer, in order, for example, to store a logic "1", it is necessary, for example, to inject electrons from the channel region of the FINFET into the memory layer. Conventionally, large voltage differences are necessary between the contact regions and the gate electrodes for such an injection process, irrespective of the underlying physical injection mechanism (using hot electrons (channel hot electrons, CHE) or using a field-supported tunnel process (Fowler-Nordheim tunneling)).

The invention solves this problem by virtue of the fact that a special channel, insulator and gate geometry is used which leads to an injection edge for the injection of charge carriers from the channel region into the memory layer being formed. The injection edge is configured in such a way that a local increase in the field occurs in its direct vicinity so that charge carriers can be efficiently injected into the memory layer even when there are comparatively small differences in electrical potential between the channel region and the gate electrode. At the same time, the injection process can be carried out by means of hot electrons (CHE) or by means of field-supported tunneling (Fowler-Nordheim tunneling). The edge effect leads to a significant reduction in the necessary programming voltage for the semiconductor memory according to the invention in comparison with conventional nonvolatile memory elements.

The channel region of the semiconductor memory is formed in a web-like rib made of semiconductor material, in particular made of silicon. In the longitudinal direction of the rib, conductively doped contact regions, which later form the source or drain contacts of the transistors, and which are preferably evenly spaced apart from one another are located in the longitudinal direction of the rib. Each contact region constitutes a source contact of a transistor and a drain contact of an adjacent transistor. The rib has an essentially rectangular shape in a sectional plane which runs perpendicular to the longitudinal axis of the rib. The upper side of the rib runs parallel to the semiconductor substrate in which the rib is formed, while the rib side faces which lie opposite one another are arranged perpendicular to the plane of the substrate. A first insulator layer, for example an oxide layer, is arranged on the upper side of the rib in each channel region of the rib. The memory layer is mounted on the first insulator layer. The memory layer projects out over at least one of the rib side faces in a direction which runs parallel to the normal direction of this rib side face.

The injection edge for injecting charge carriers from the channel region into the memory layer is formed by the edge which is defined by this rib side face and the upper side of the rib. The rib side face is spaced apart from the gate electrode by a second insulator layer, it being possible by means of the gate electrode to control the conductivity of the channel region by means of the field effect. The gate electrode extends in the normal direction of the semiconductor substrate beyond the upper side of the rib, preferably as far as the upper side of the memory layer. In this region, the gate electrode is spaced apart from the memory layer by the third insulator layer.

A difference in electrical potential between the channel region and the gate electrode leads, with such geometry, to a local increase in the field in the region of the injection edge so that, when there are comparatively small differences in potential, charge carriers leave the channel region at the injection edge and can be captured by the memory layer.

The memory layer preferably projects in a direction which runs parallel to the normal directions of the rib side faces, beyond the two rib side faces of the rib. In this direction running transversely with respect to the rib, the width of the rib is thus preferably smaller than the width of the memory layer. If, as described above, a gate electrode is also arranged on this rib side, the edge region between the upper side of the rib and the second rib side face in the channel region constitutes a second injection edge for charge carriers into the memory layer.

The second insulator layer preferably has a greater layer thickness than the third insulator layer. The third insulator layer has, for example, a layer thickness of 3 nm to 6 nm, typically 5 nm, while the second insulator layer is approximately 2 nm to 5 nm thicker. The first insulator layer typically has a layer thickness of 2 to 5 nm if it is formed from silicon dioxide.

The second insulator layer preferably has an inner oxide layer which is arranged at least on the one rib side face, and an outer oxide layer which is arranged on the inner oxide layer.

The third insulator layer is preferably formed by the outer oxide layer. The outer oxide layer extends in the normal direction of the semiconductor substrate beyond the inner oxide layer and isolates the gate electrode from the memory layer. The outwardly pointing surface of the outer oxide layer preferably forms an essentially planar face, in particular in the region of the upper side of the rib.

The inner oxide layer is preferably a thermal oxide, and the outer oxide layer is an HT oxide (high temperature oxide, HTO). If the inner oxide layer is formed by oxidation of the semiconductor material of the rib, a particularly advantageous injection edge geometry is produced. The oxidation process of the semiconductor material of the rib when the first insulator layer and memory layer have already been applied causes, in fact, the injection edge to form, in a sectional face running perpendicularly with respect to the longitudinal axis of the rib, an internal angle which is smaller than 90°. This injection edge geometry is produced owing to the oxidation rate variation of the semiconductor material of the rib in the region of the first insulator layer. An injection edge which comes to a point in such a way is particularly suitable for bringing about a local increase in a field, as a result of which the programming voltages of the memory layer can be reduced further.

The first insulator layer is preferably formed from a thermal oxide. The layer thickness of the thermal oxide is, for example, 2 to 5 nm.

The rib is preferably arranged in a top silicon layer of a SOI (silicon-on insulator) substrate. The face of the rib lying opposite the upper side of the rib adjoins the "buried oxide" (BOX) of the SOI substrate. The top silicon layer (also referred to as body silicon layer) of the SOI substrate typically has a layer thickness of 20 nm to 50 nm. The width of the rib which is patterned in this top silicon layer, which is also referred to as a fin, is, for example, between 40 and 100 nm. Alternatively, the rib can also be insulated from adjacent ribs by a highly doped well underneath the rib. If the semiconductor material of the rib is, for example, weakly p-doped, a highly doped $p^+$-well can be used for electrically insulating the ribs from one another.

A plurality of ribs which are evenly spaced apart from one another is preferably provided, the longitudinal axes of said ribs running parallel to one another and a plurality of memory cells being formed in each of the ribs. The distances between the ribs which run in parallel are limited by the gate electrode to be patterned and the processing techniques available.

The memory layer is preferably what is referred to as a trapping layer or a floating gate. The trapping layer is an electrically nonconductive layer with a plurality of what are referred to as trapping states which can capture charge carriers. In contrast, the floating gate is electrically conductive.

The trapping layer is preferably a nitride layer, a silicon-rich oxide layer or a undoped polysilicon layer which are separated from the channel region and the gate electrode by oxide layers. If the trapping layer is a silicon nitride layer which is surrounded by oxide, in particular silicon dioxide, the memory layer arrangement is what is referred to as an ONO stack. Such a trapping layer is preferably programmed by means of hot channel electrons (channel hot electrons; CHE) which are accelerated by a strong forward voltage and a positive gate voltage and drawn into the memory layer. The erasure of the trapping layer is preferably carried out by injecting "hot holes" into the trapping layer (referred to as "band-to-band tunnel enhanced hot hole injection") in a way analogous to the erasure process in the NROM memory cells mentioned at the beginning.

As a result of the point effect of the injection edge, even gate voltages in the region of 5 to 7 V are sufficient to generate field strengths in order to move electrons (or holes of a p-type channel transistor) onto the trapping layer. Voltages of approximately 5 V are also sufficient to erase the trapping layer.

Two gate electrodes which are electrically insulated from one another are preferably provided for the at least one rib, with the gate electrodes extending in the direction of the longitudinal axis of the rib and being spaced apart from the rib side faces lying opposite by second insulator layers. In this case, preferably two injection edges are provided for each channel region of each rib, said injection edges being formed by the edges between the rib side faces lying opposite and the upper side of the rib. The gate electrodes run along the edges of the rib structure parallel to the longitudinal axis of the rib. They form the word lines of the semiconductor memory.

In such an arrangement, it is possible to store a maximum of 4 bits in each trapping layer above each channel region. As a result, 2 bits can be stored in the memory layer near to the first contact region, in each case close to the injection edges lying opposite. A further 2 bits can be stored in the memory layer near to the second contact region in areas near to the injection edges lying opposite. This arrangement thus permits a 2 bit memory cell which has a $2F^2$ surface density to be formed, F being the smallest structure size of the semiconductor memory. In order to read out the bits, the reading method which is proposed by B. Eitan in the publication mentioned at the beginning and is known in NROM memory elements is preferably used. In this context, reference is made in its entirety to the disclosed content of the publication mentioned at the beginning by B. Eitan et al. and to the international patent application WO 99/07000 (PCT/IL 98/00363), which documents are an integral component of the disclosure of the present application with respect to the reading, programming and erasure method described in them and therefore are incorporated herein by reference in their entireties.

The gate electrodes are preferably formed from highly doped polysilicon. Such gate electrodes may preferably be manufactured by what is referred to as a spacer etching method in a self-aligning fashion. Nitride is preferably provided as an insulation between the gate electrodes of adjacent ribs. The two gate electrodes of each rib may be doped differently in order to bring about different characteristic curve profiles of the left-hand and right-hand side wall transistors.

Two gate electrodes which are insulated from one another are preferably provided as word lines of the semiconductor memory for each of the ribs, said semiconductor memory having a plurality of ribs which are evenly spaced apart from one another.

The semiconductor memory preferably has a plurality of bit lines running perpendicularly with respect to the word lines, each of the bit lines being electrically connected to one of the contact regions of each rib. The word lines and bit lines result in a column and row arrangement of a memory cell array in which each source contact or drain contact of the rib transistors can be driven selectively so that what is referred to as a "virtual ground array (VGA)" is formed.

As an alternative to a memory layer which is formed as a trapping layer, it is possible for the memory layer also to be a floating gate made of metal or highly doped polysilicon.

According to one preferred embodiment, the semiconductor memory comprises a plurality of gate electrodes, each of the channel regions in one of the ribs being assigned precisely one of the gate electrodes which runs as a word line of the semiconductor memory perpendicularly with respect to the longitudinal axis of the ribs over a plurality of ribs. In contrast to the embodiment described above, in the present embodiment the gate electrodes, i.e. the word lines, run perpendicularly with respect to the ribs. "Bit lines" in the narrower sense are not present in this NAND arrangement but instead are formed by a series circuit of the rib transistors along each rib. The memory layers of such memory cells are programmed by means of field-supported tunneling which is known as Fowler-Nordheim tunneling. In this case also, the local increase in the field along the injection edge leads to a significant reduction in the programming voltages required.

The floating gate preferably has at least one erasure edge for injecting charge carriers from the floating gate to the (control) gate electrode through the third insulator layer. The erasure edge is preferably located in the direct vicinity of the injection edge. The erasure edge of the floating gate preferably adjoins an edge region which is formed by the first insulator layer and the third insulator layer. In other words, the erasure edge is formed by that memory layer material which adjoins the edge which is defined by the first insulator layer and the third insulator layer. By means of a suitable forward voltage of the channel region with respect to the gate electrode, it is possible to initiate field-supported tunneling of electrons starting from the erasure edge into the channel region or gate electrode region.

The memory density of such an NAND arrangement is less than with the "virtual ground array (VGA)" described above and is approximately 4 to 5 $F^2$. However, compared to conventional NAND memories, there is a significant reduction in the necessary programming and erasure voltages. As a result, the area necessary for charge pumps is reduced, which allows the degree of integration to be increased and thus the manufacturing costs to be lowered. In addition, an increased read-out rate can be achieved since the reading current for the individual memory cells is increased in comparison with conventional planar components by the side wall transistors.

According to another aspect of the present invention, a method for manufacturing a semiconductor memory includes the following steps (1) provision of a SOI substrate with a top silicon layer; (2) application of the first insulator layer to the top silicon layer; (3) application of the memory layer to the first insulator layer; (4) patterning of the top silicon layer, the first insulator layer and the memory layer into at least one web-like rib shape, wherein the first insulator layer is arranged on the upper side of the rib of the rib which is composed of silicon, and the memory layer is arranged on the first insulator layer; (5) oxidation of the rib side faces of the rib in order to form an inner oxide layer of the second insulator layer; (6) application of the third insulator layer; (7) application of the at least one gate electrode; and (8) local doping of the rib in order to form doped contact regions.

In accordance with the method according to the invention, the top silicon layer is firstly patterned with the first insulator layer arranged on it and the memory layer into a web-like rib shape. Transversely with respect to the rib made of semiconductor material, the first insulator layer and the memory layer are of the same width at this processing stage. An oxidation step for the rib side faces of the rib is subsequently carried out in order to form an inner oxide layer which constitutes part of the second insulator layer. An acute-angled injection edge is produced in the rib in the edge region of the upper side of the rib with each of the rib side faces by means of the oxidation rates which are different in the edge region near to the first insulator layer, which is advantageous for efficient charge carrier injection. The third insulator layer is then defined.

The application of the third insulator layer preferably includes applying an outer oxide layer which is arranged on the memory layer and on the inner oxide layer. The third insulator layer, which isolates the gate electrode from the memory layer, may be composed, for example, of a CVD-deposited high temperature oxide (HTO) which is deposited all over the outer face of the inner oxide layer and the exposed faces of the memory layer.

BRIEF DESCRIPTION OF THE DRAWING FIGURES

The foregoing and other features of the present invention will be more readily apparent from the following detailed description and drawings of the illustrative embodiments of the invention wherein like reference numbers refer to similar elements and in which.

DETAILED DESCRIPTION OF PREFERRED EMBODIMENTS

Figure 1:
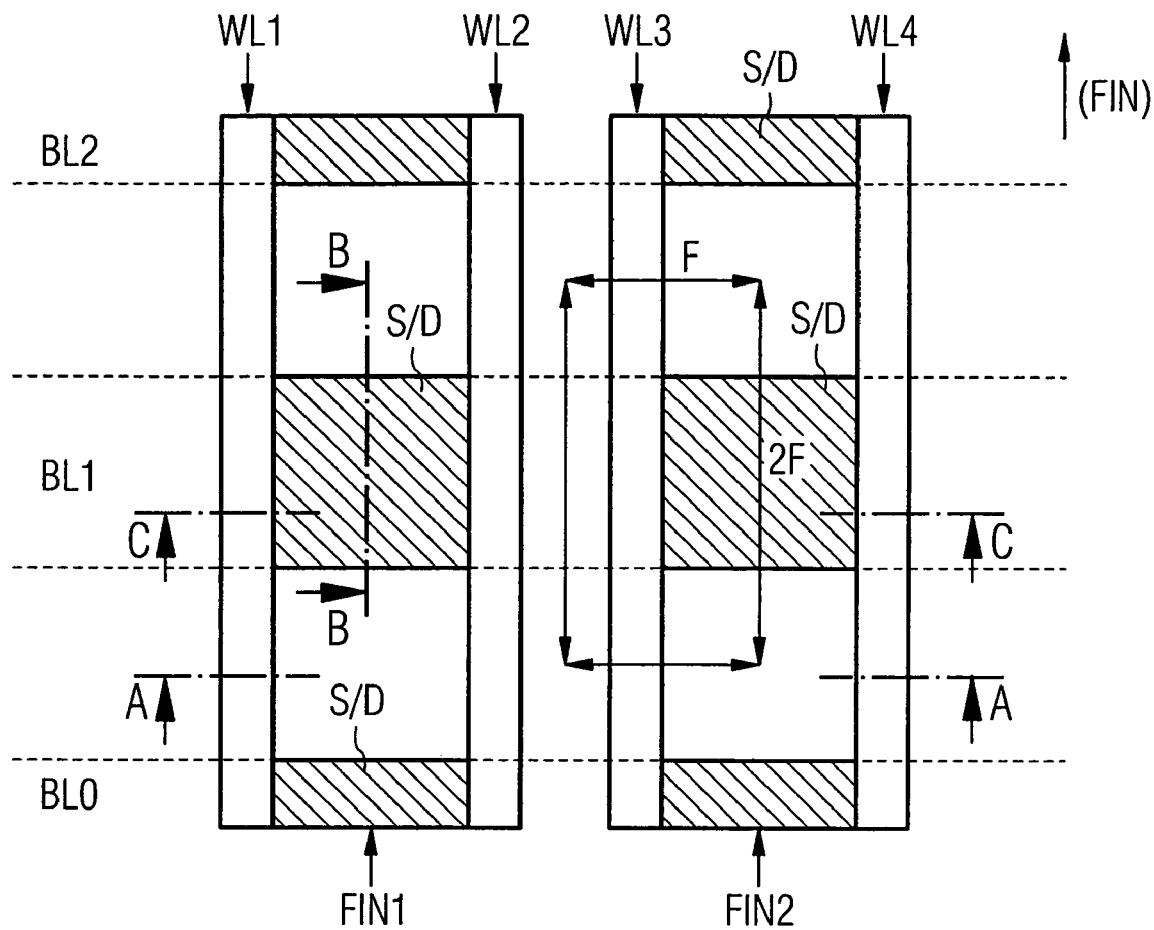
FIG. 1 shows a simplified, schematic plan view of a memory cell array of a preferred embodiment of the semiconductor memory according to the invention in a "virtual ground array"

FIG. 1 shows a highly schematic plan view of a memory cell array of a preferred embodiment of a semiconductor memory according to the invention. Word lines which extend along edges of two web-like ribs (fins) made of silicon are designated by WL1, WL2, WL3 and WL4. The first web-like rib extends between the word line WL1 and the word line WL2 in the direction designated by the arrow (FIN) and is provided with the reference FIN1. The second rib extends between the word line WL3 and the word line WL4 and is provided with the reference FIN2. It should be noted that FIG. 1 only constitutes a small detail of a large memory cell array in which a plurality of ribs FIN which run parallel to one another are provided evenly spaced apart from one another.

Highly doped contact regions S/D which are spaced apart from one another by a distance F are provided in the ribs FIN and are highlighted in FIG. 1 by a dot pattern. In each case, two adjacent contact regions S/D of each rib FIN form the source and drain terminals, respectively of a FINFET whose channel region is arranged in the rib FIN between these contact regions S/D. Bit lines BL, which run essentially perpendicularly with respect to the word lines WL, are used to make contact with the contact regions S/D. Contact is made with one contact region S/D per rib FIN by means of each bit line BL. The bit lines BL are represented by dashed lines in FIG. 1.

Figure 2:
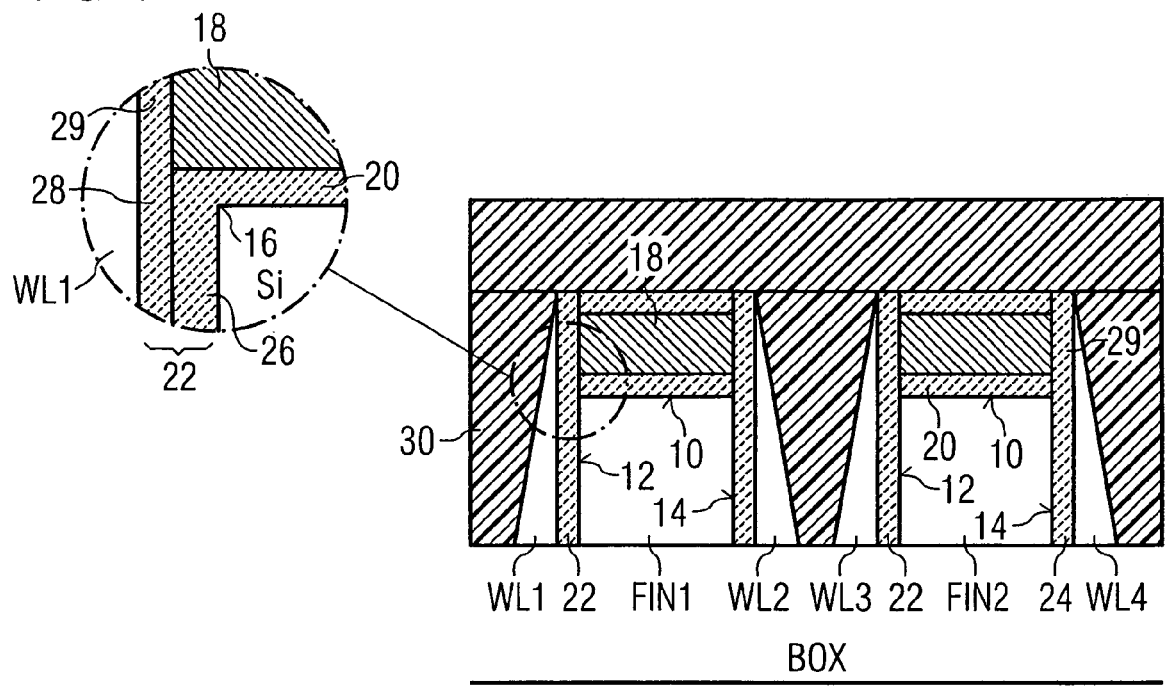
FIG. 2 shows a schematic cross-sectional view along the line A—A in FIG. 1.

A schematic cross-sectional view along the line A—A in FIG. 1 is shown in FIG. 2. The ribs FIN1, FIN2 have an essentially rectangular shape in this sectional plane running perpendicularly with respect to its longitudinal axis. The ribs FIN are formed in a top silicon layer (body silicon layer) of an SOI substrate whose buried oxide layer is designated by BOX.

Underneath the buried oxide layer BOX there is typically a silicon wafer which is not illustrated in more detail in FIG. 2. The ribs FIN have an upper side 10 of the rib which is turned away from the buried oxide layer BOX, and two rib side faces 12, 14 lying opposite one another. The upper side 10 of the rib runs essentially parallel to the SOI substrate plane, i.e. parallel to the buried oxide layer BOX. The rib side faces 12, 14 are essentially perpendicular to the substrate plane. The rib side faces 12, 14 are spaced apart from one another, preferably by 40 to 200 nm, particularly preferably by 40 to 60 nm.

In the inset illustrated in FIG. 2, the edge region between the rib side face 12 and the upper side 10 of the rib FIN1 is illustrated in a magnified form. The rib side face 12 forms, at its contact point with the upper side 10 of the rib, an injection edge 16 whose effects are described in more detail below. The upper side 10 of the ribs FIN is isolated from a memory layer 18 by a first insulator layer 20. In the embodiment illustrated in FIG. 2, the first insulator layer 20 is composed of a silicon dioxide layer, preferably of a thermal silicon dioxide layer. The memory layer 18 is configured as what is referred to as a trapping layer which has a plurality of "trap" states for trapping charge carriers. The memory layer 18 is, for example, composed of silicon nitride.

In the cross section illustrated in FIG. 2, the memory layer 18 has an essentially rectangular cross section, the width of the memory layer 18 being greater than the width of the ribs FIN (distance between the rib side faces 12 and 14). The channel region of the ribs FIN, which is illustrated in FIG. 2, is isolated by second insulator layers 22, 24 from the adjoining word lines WL1 and WL2, WL3 and WL4, respectively. The word lines WL form the gate electrodes of the "side wall transistors" with a design similar to a FINFET. The second insulator layer 22 is preferably composed of an inner oxide layer 26 and an outer oxide layer 28. The second insulator layer 24, which isolates the rib side face 14 from the word line WL2 or WL4, respectively, is also identically composed of an inner and an outer oxide layer. If the ribs FIN are formed from silicon, silicon dioxide is preferably used for the oxide layers. The inner oxide layer 26 and the outer oxide layer 28 preferably each have a layer thickness of approximately 2 to 5 nm.

The outer oxide layer 28 preferably extends from the buried oxide layer BOX along the outer face of the inner oxide layer 26 and along the side faces of the memory layer 18. As a result, the memory layer 18 projects out in a direction of the rib side faces 12, 14 which is parallel to the normal direction, by the layer thickness of the inner oxide layer 26. The word lines WL (gate electrodes) adjoin the outer faces of the outer oxide layers 28. The section of the outer oxide layer 28 which is arranged between a WL and the associated memory layer 18 is referred to as a third insulator layer 29.

The word lines are preferably formed from highly doped polysilicon, it being possible for the two word lines WL which are assigned to one rib FIN to be doped differently. For example, the "left-hand" word line WL1 of the rib FIN1 can be $n^+$-doped, while the "right-hand" word line WL2 is $p^+$-doped. As a result, different threshold voltages of the side wall transistors can be brought about. All the other faces of the memory layer 18 are also bounded by insulator layers, preferably oxide layers, so that the memory layer 18 is completely electrically insulated from its surroundings.

In order to "program" a "bit" in the memory layer 18, an injection process of hot channel electrons is used, for example. For this purpose, a strong forward voltage is built up in the transistor channel in which, for example, a first contact region S/D (source contact) is connected to 0 V, and an adjacent, second contact region S/D (drain contact) is connected to 2 to 5 V, depending on the channel length. In addition, for example the word line WL1, which is assigned to this rib FIN1, is connected to a potential of 5–7 V. If the transistor is an n-type channel transistor, hot channel electrons near to the drain contact are generated given these potential conditions in a known fashion. As a result of the injection edge 16, a local increase in the field occurs between the channel region (i.e. of the rib FIN1) and the word line WL1 (gate electrode) owing to the edge effect, the path with the greatest field strength running from the injection edge 16 to the gate electrode through the memory layer 18. As a result, the hot electrons are injected near to the second contact region (drain region) from the injection edge 16 into a region of the memory layer 18 which is close to the injection edge 16. Given a memory layer 18 which is configured as a trapping layer, the electrons which are introduced into the memory layer 18 in this way are "trapped" and held in the memory layer 18.

As is known, for example, with NROMs, the charge carriers which are trapped in the memory layer 18 bring about a shift in the threshold voltage of the associated side wall transistor, which can be detected when the cell is read out. The reading method used here is preferably the one which is described by B. Eitan et al. in "NROM: A novel localized trapping, 2-bit nonvolatile Memory Cell" in IEEE Electron Device Letters vol. 21, No 11, November 2000, and in WO 99/97000. With respect to the programming, erasure and reading method, reference is made to the above-mentioned publications, in their entirety, so that their disclosed content is an integral component of the overall disclosure of the present application.

The embodiment illustrated in FIGS. 1 and 2 is distinguished in particular by the fact that the necessary programming voltages using the "channel hot electron (CHE)" are considerably lower than the programming voltages known from conventional EEPROM memories since a selectively built-up local increase in the field between the injection edge 16 and the word lines WL occurs in order to inject the charge carriers out of the channel region near to the drain into the memory layer 18. As a result, less area for increased programming voltages has to be provided on the memory chip, permitting a higher integration density of the memory and thus allowing the manufacturing costs to be reduced.

The ribs FIN are dimensioned in terms of their width in such a way that a bit which is stored, for example, near to the word line WL1 in the memory layer 18 only influences the channel conductibility of the side wall transistor at the rib side face 12, but does not lead to a significant shift in the characteristic curve or threshold of the side wall transistor which is formed on the rib side face 14. The "interference" between the influence of the "left-hand" bit and the "right-hand" bit in the memory layer 18 limits the minimum width of the ribs FIN.

In order to erase the charge carriers (electrons or holes) which have been introduced into the memory layer 18 in the programming step, 0 V is applied, for example, to the second contact region (drain contact), 5 V is applied to the first contact region (source contact), and −5 V is applied to the gate electrode. The n-type channel side wall transistor is driven to strong accumulation by these potential conditions, which leads to what is referred to as "band-to-band tunnel enhanced hot hole injection". The hot holes which were injected into the memory layer 18 by the injection edge 16 neutralize the hot electrons which were introduced during the programming. The programming and erasure of a p-type channel transistor requires reversed voltage conditions in each case.

The ribs FIN preferably have a height (distance between the lower side of the rib adjoining the buried oxide layer BOX and the upper side 10 of the rib of 20 to 50 nm). The separate driving of the left-hand and right-hand side wall transistor (transistor channels running at the rib side faces 12 and 14) can be stored in the chargers on both sides of the memory layer 18. By using the read-out technology known from NROMs it is thus possible to store a total of four bits near to the contact regions S/D in the corner regions of each memory layer 18. This permits a high-density $1F^2$ memory element to be formed with a $2F^2$ cell with two bits each. The $2F^2$ cells are illustrated schematically in FIG. 1.

Figure 3:
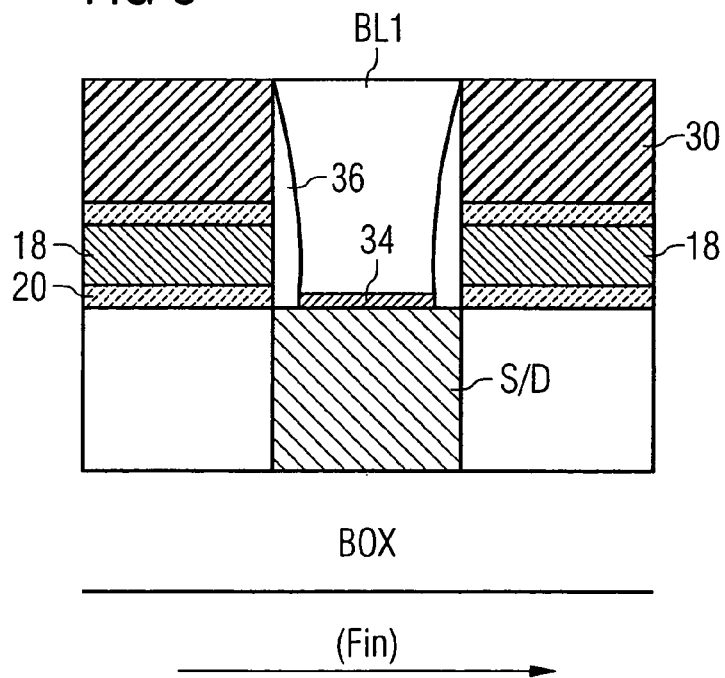
FIG. 3 shows a schematic cross-sectional view along the line B—B in FIG. 1.

FIG. 3 shows a schematic cross-sectional view along the sectional line B—B in FIG. 1. The plane of the section runs through the bit line BL1 and one of the contact regions S/D of the cell array. The gate electrodes WL are electrically insulated from one another by an insulating jacket 30, preferably composed of silicon nitride. The longitudinal direction of the rib FIN 1 is indicated schematically in FIG. 3 by an arrow designated by (FIN). The bit line BL1 is electrically connected to a highly doped contact region S/D by a diffusion barrier 34. The bit line BL1 is composed of metal, preferably tungsten, and is separated from the memory layer 18 and the word lines WL in the plane of the section represented in FIG. 3 by spacers 36 which are preferably composed of a HTO oxide (high temperature oxide).

The preferred embodiment of a semiconductor memory according to the invention which is described in FIGS. 1 to 3 is distinguished in particular by lower programming voltages than in conventional NROM or ETOX cells. In addition, less surface area is required for charge pumps as a result of the reduction in the required peak voltage. The separate driving of the left-hand and right-hand edges of the FINFETs (left-hand and right-hand side wall transistors) also permits the outstanding memory density of $1F^2$ per bit.

Figure 4:
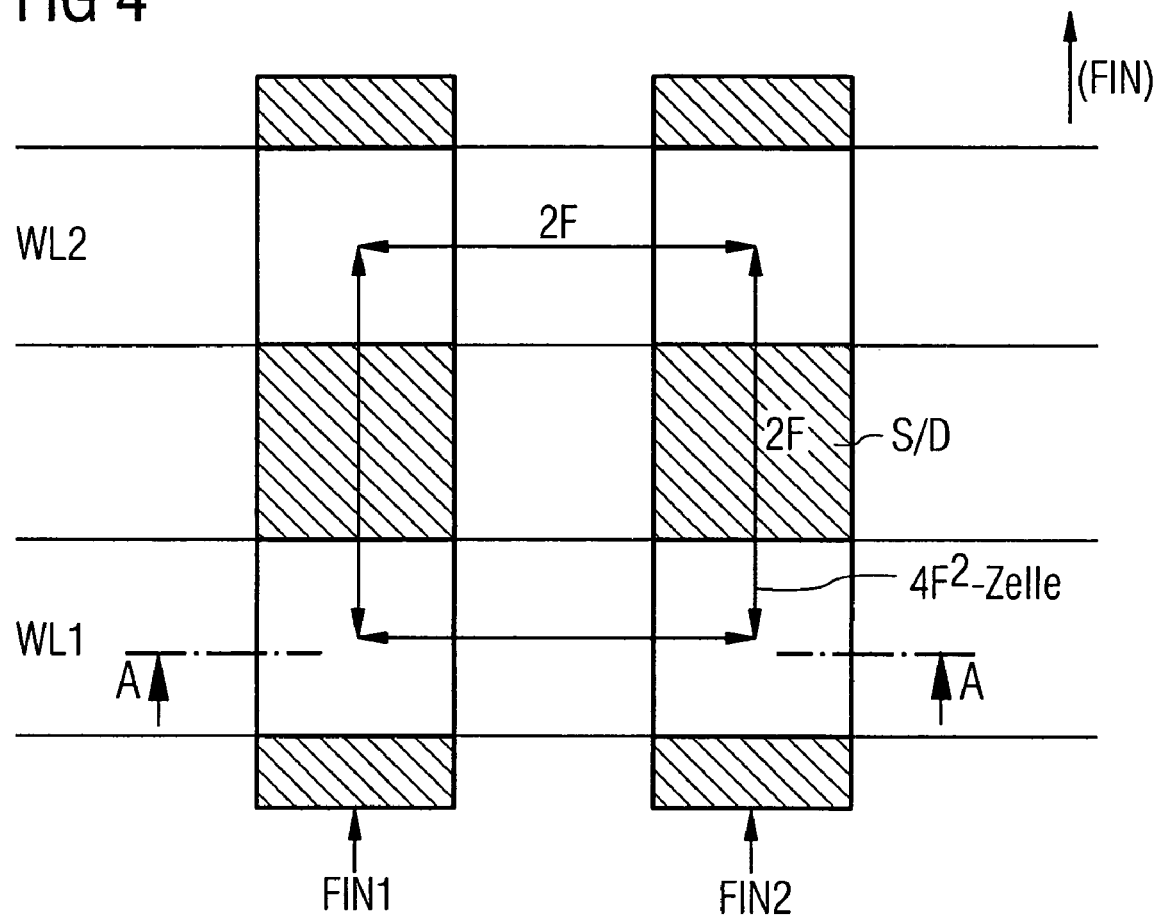
FIG. 4 shows a schematic plan view of a cell array of a further preferred embodiment of a semiconductor memory according to the invention in an "NAND" array.
Figure 5:
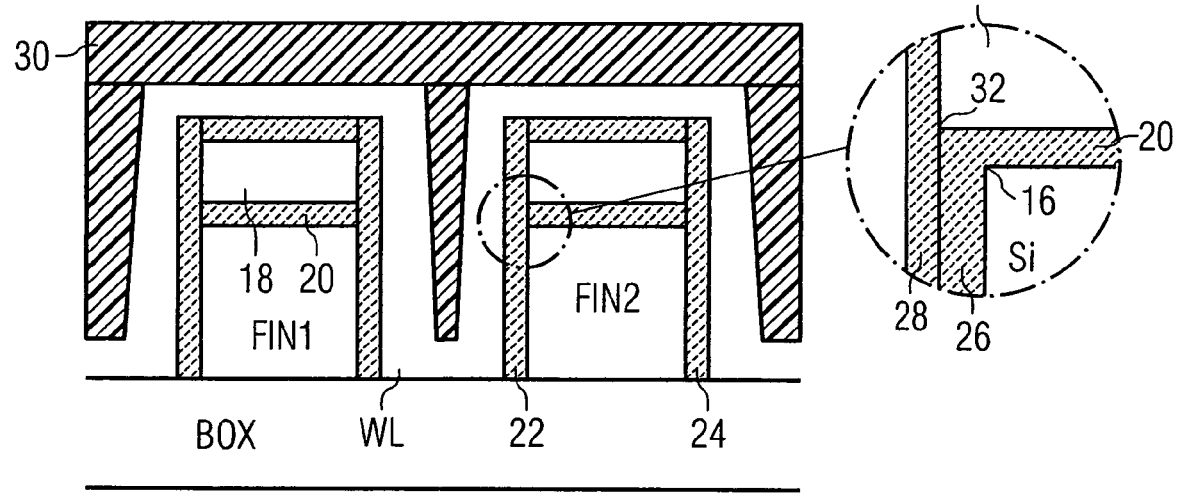
FIG. 5 shows a schematic cross-sectional view along the line A—A in FIG. 4.

FIG. 4 shows a schematic plan view of a further embodiment of a semiconductor memory according to the invention. Identical or similar features which have already been described with respect to FIGS. 1–3 are provided with the same references in FIGS. 4 and 5 and they will not be described again. While the embodiment described with reference to FIGS. 1–3 is what is referred to as a "virtual ground array (VGA)", FIGS. 4 and 5 show a memory cell array in what is referred to as an NAND arrangement. The direction in which the web-like ribs FIN made of semiconductor material run is represented again by an arrow designated by (FIN). However, in contrast to the arrangement illustrated in FIG. 1, the word lines WL run essentially perpendicularly with respect to the longitudinal direction (FIN) of the ribs FIN. "Bit lines" in the narrower sense are not present with such an NAND arrangement of the memory cells but instead are composed of a series circuit of a plurality of transistors with a FINFET-like design.

FIG. 5 shows a schematic cross section along the sectional line A—A in FIG. 4. The plane of the section runs through the ribs FIN1 and FIN 2 along the word line WL1. In contrast to the embodiment described above, the word lines WL, i.e., the gate electrodes, run perpendicularly with respect to the longitudinal axes of the ribs. The memory layer 18 is embodied as an electrically conductive floating gate which is composed, for example, of highly doped polysilicon. Applying a strong positive charge to the word line WL with respect to the channel region of the transistors leads to a field-supported tunnel injection of electrons from the injection edge 16 to the floating gate 18 through the first insulator layer 20 (cf. inset in FIG. 5). As a result of the edge effect of the injection edge 16, even differences in potential which are significantly lower than the programming voltages known from conventional NAND memory cells are sufficient for this so-called Fowler-Nordheim tunneling of the charge carriers from the channel region into the memory layer 18.

In order to erase the conductive floating gate, an erasure edge 32 is preferably used, which is formed in the floating gate 18 in the edge region of the first insulator layer 20 with the outer oxide layer 28. The memory density of this embodiment is, with 4 to 5 $F^2$ (cf. the 4 $F^2$ memory cell shown in FIG. 4) lower than in the first embodiment described in conjunction with FIGS. 1–3. However, in comparison with conventional NAND memories, a significant reduction in the voltage is expected as a result of the use of a peak or edge effect both for the programming and for the erasure of the memory layer 18. In addition, a higher read-out rate can be achieved since the reading current of the individual memory cells is amplified by the side wall transistors in comparison with conventional planar components.

Figure 6:
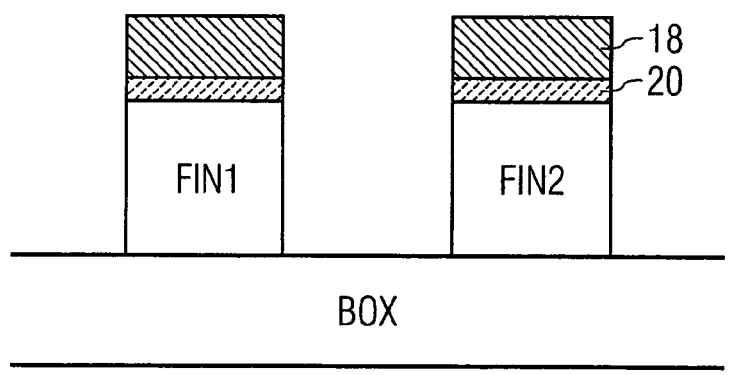
FIGS. 6–9 show schematic cross-sectional views of intermediate products of the preferred semiconductor memory illustrated in FIG. 1, along the line A—A.

FIGS. 6–14 show schematic sectional views of intermediate products of a preferred semiconductor memory according to the invention, as has been described in conjunction with FIGS. 1–3. FIG. 6 shows a schematic cross-sectional view of an intermediate product of the semiconductor memory of FIG. 1 along the line A—A. At first, a thermal oxide is formed on a SOI wafer (silicon on insulator wafer), with the oxide later constituting the first insulator layer 20. A silicon nitride layer, which later forms the memory layer 18 (trapping layer) is applied to the oxide layer 20. A layer made of TEOS is subsequently applied to the nitride layer 18. Windows are opened in the resist between the ribs FIN by means of optical lithography or electron beam lithography, and the TEOS, nitride, oxide and top silicon layers are eroded by means of an etching step so that a web-like rib structure (fin structure) is formed. The resist and the TEOS layer are then removed. The intermediate product which is obtained according to this method step is illustrated in FIG. 6.

Figure 7:
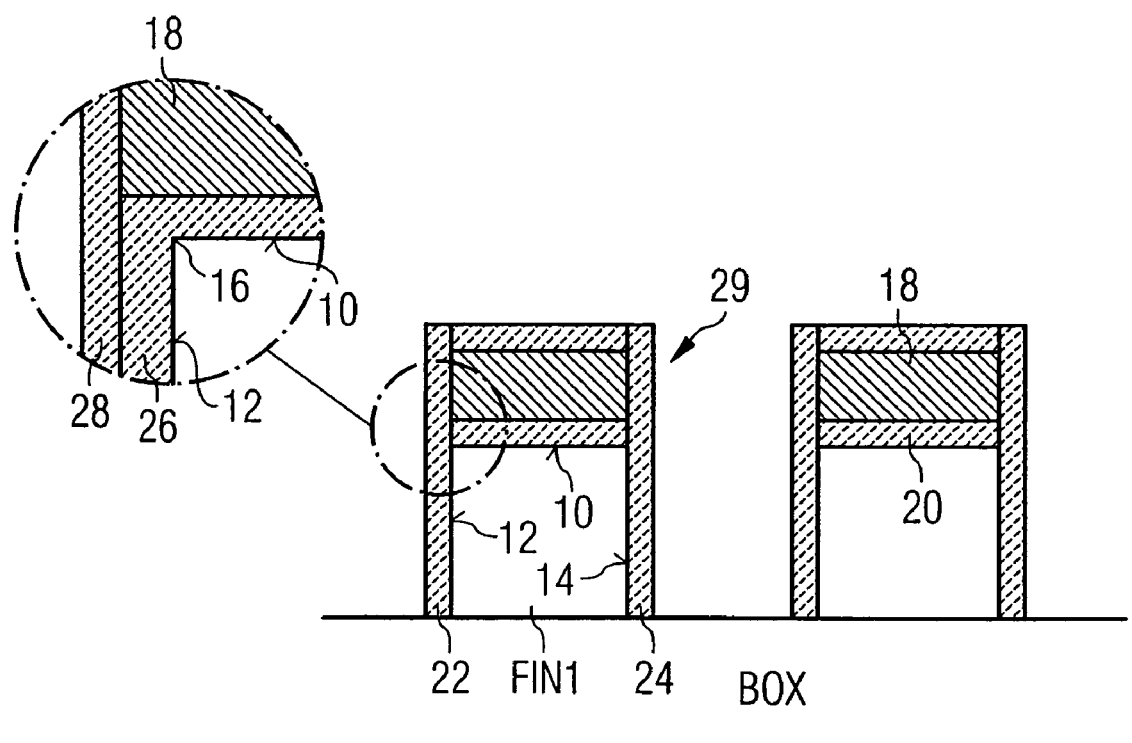

The rib side faces 12, 14 are subsequently oxidized thermally in order to produce the injection edges 16. Owing to the lower oxidation rate of the ribs FIN near to the first insulator layer 20, the rib side faces 12, 14 have a curved profile near to the first insulator layer 20. The injection edges 16 therefore will not have a rectangular edge profile as illustrated in a simplified form in the figures. The different oxidation rates in the region of the upper side 10 of the rib cause the injection edges 16 to have an internal angle which is less than 90°. Such injection edges 16 are particularly suitable for local increases in a field—and as a result lower necessary programming voltages. After the thermal oxidation in order to produce the inner oxide layers 26, a high temperature oxide (HTO) is deposited as an outer oxide layer 28. The oxide layer 28 forms what is referred to as the "control gate oxide" which constitutes the third insulator layer 29. The intermediate product according to this method step is illustrated in FIG. 7.

Figure 8:
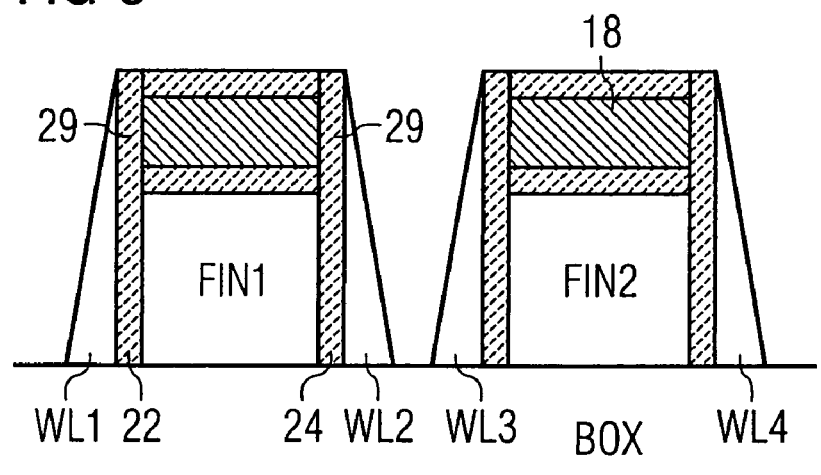
Figure 9:
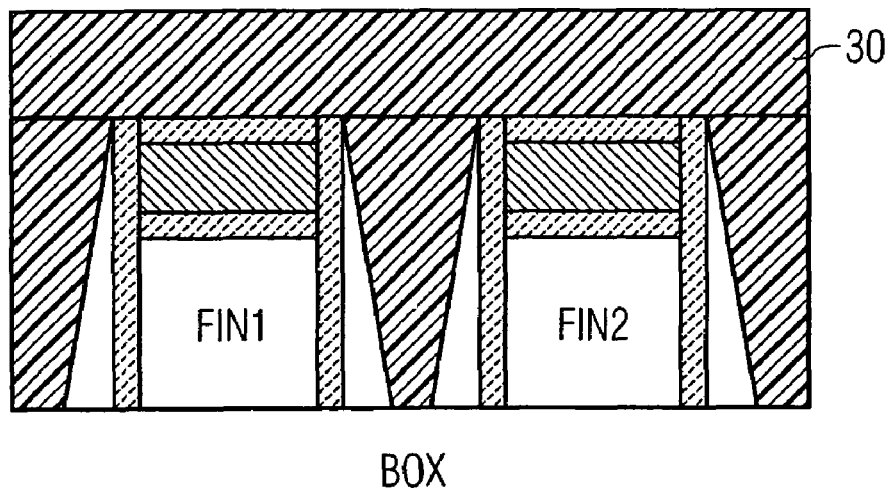

Polysilicon is then deposited and is highly doped in situ in order to form the word lines. As illustrated in FIG. 8, the schematically illustrated cross section of the word lines WL is obtained by means of spacer etching which, without additional mask technology, causes word lines WL which run along the edges of the ribs FIN to be formed in a self-aligned fashion. This state is illustrated schematically in FIG. 8.

Figure 10:
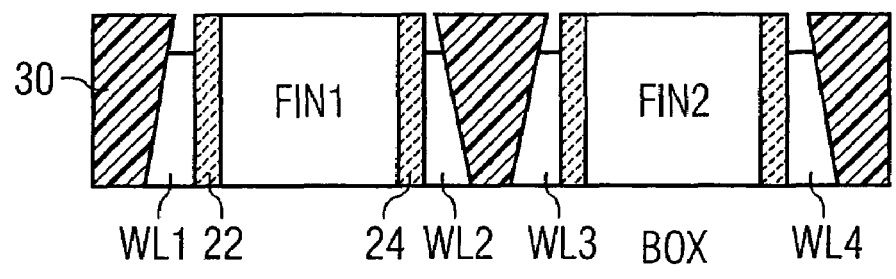
FIGS. 10–14 show schematic cross-sectional views of intermediate products of the semiconductor memory illustrated in FIG. 1, along the line C—C.
Figure 11:
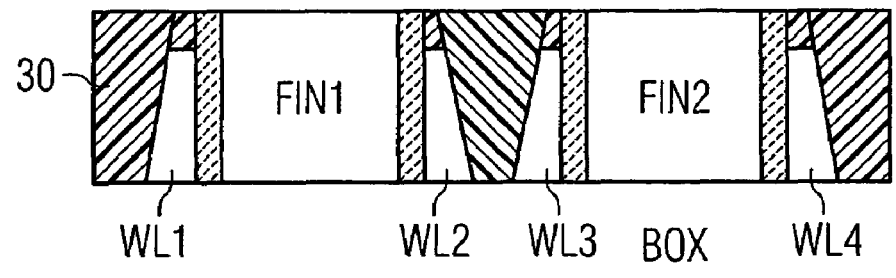
Figure 12:
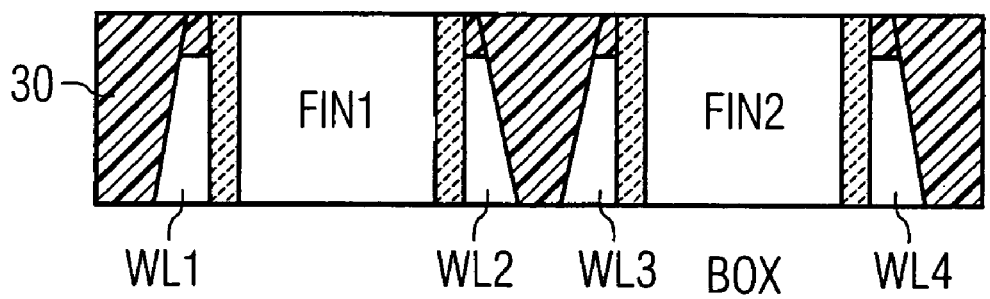

After the intermediate spaces have been filled by nitride (cf. FIG. 9), the bit lines are patterned. FIG. 10 shows a section along the bit line BL1 in a schematic cross-sectional view along the line C—C in FIG. 1 of the later semiconductor memory. The bit line BL1, which later runs parallel to the plane of the drawing of FIGS. 10–14 is prepared by a photo step with subsequent etching steps for the nitride layer which forms the insulating jacket 30, the HTO layer which is arranged on the memory layer 18, the memory layer 18 (nitride layer), back etching of the polysilicon word line WL and etching of the first insulator layer 20 (oxide layer), (cf. FIG. 10). Nitride is then filled into the back-etched word line space and back etched (FIG. 11). The subsequent HTO deposition and spacer etching of the HTO oxide to form the spacer layer 36 shown in FIG. 3 is not shown in the cross-sectional view illustrated in FIG. 12. The HTO spacer layer 36 protects the memory layer 18 (nitride trapping layer) on the wall of the word line WL and avoids a short circuit to it.

Figure 13:
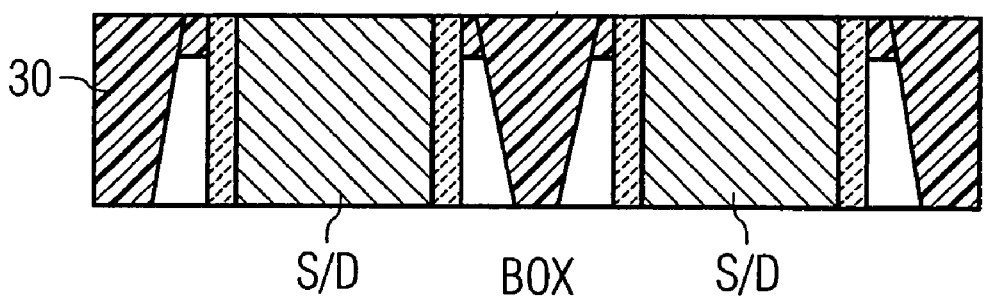
Figure 14:
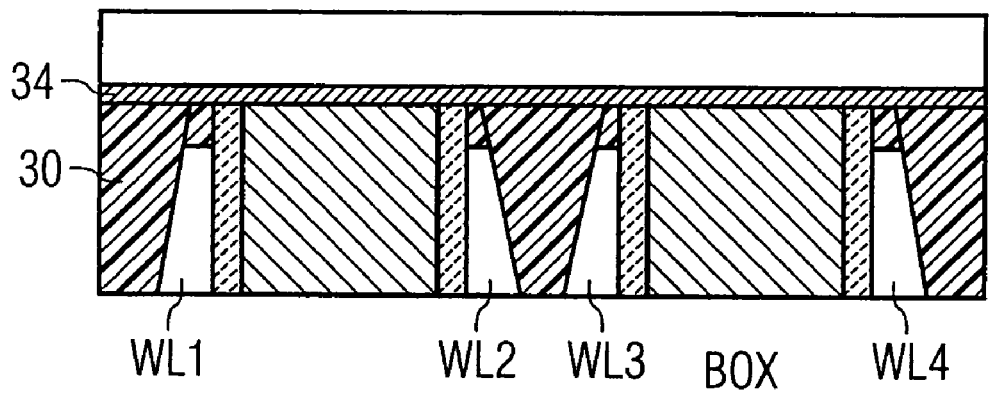

FIG. 13 shows the intermediate product after $n^+$ implantation of the contact regions S/D has taken place. The contact regions S/D (source and drain contact regions of the FIN-FETs) are electrically connected to a metallic bit line BL via a diffusion barrier 34 by means of bit lines BL which run perpendicularly with respect to the word lines WL. A CMP (chemical mechanical polishing) step is used to erode and planarize the surface of the bit line BL. The semiconductor memory device is illustrated in this state in FIG. 14.

Having described embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

The invention claimed is:

1. A semiconductor memory having a plurality of memory cells, wherein each memory cell comprises:
    a first conductively doped contact region, a second conductively doped contact region and a channel region which is arranged between the latter, these regions being formed in a web-like rib made of semiconductor material, and arranged one behind the other in this sequence in the longitudinal direction of the rib, wherein the rib has, at least in a section in the channel region running perpendicularly with respect to the longitudinal direction of the rib, an essentially rectangular shape with an upper side of the rib and rib side faces lying opposite;
    a memory layer which is configured for programming the memory cell and is arranged on the upper side of the rib spaced apart by a first insulator layer, wherein the memory layer projects in the normal direction of the one rib side face over at least one of the rib side faces so that the one rib side face and the upper side of the rib form an injection edge for injecting charge carriers from the channel region into the memory layer; and at least one gate electrode which is spaced apart from the one rib side face by a second insulator layer, and from the memory layer by a third insulator layer, wherein the gate electrode is electrically insulated from the channel region and is configured to control its electrical conductivity;

wherein the second insulating layer has a greater layer thickness than the third insulator layer.

2. The semiconductor memory as claimed in claim 1, wherein the first insulator layer is formed from a thermal oxide.

3. The semiconductor memory as claimed in claim 1, wherein the rib is arranged in a top silicon layer of an SOI substrate.

4. The semiconductor memory as claimed in claim 1, wherein a plurality of ribs which are evenly spaced apart from one another is provided, the longitudinal axes of said ribs running parallel to one another and a plurality of memory cells being formed in each of the ribs.

5. The semiconductor memory as claimed in claim 1, wherein the second insulator layer has an inner oxide layer which is arranged at least on the one rib side face, and an outer oxide layer which is arranged on the inner oxide layer.

6. The semiconductor memory as claimed in claim 5, wherein the outer oxide layer forms the third insulator layer.

7. The semiconductor memory as claimed in claim 5, wherein the inner oxide layer is a thermal oxide, and the outer oxide layer is an HT oxide.

8. The semiconductor memory as claimed in claim 6, wherein the inner oxide layer is a thermal oxide, and the outer oxide layer is an HT oxide.

9. The semiconductor memory as claimed in claim 1, wherein the memory layer is one of a trapping layer and a floating gate.

10. The semiconductor memory as claimed in claim 9, wherein the trapping layer is a nitride layer, a silicon-rich oxide layer or an undoped polysilicon layer which are separated from the channel region and the gate electrode by oxide layers.

11. The semiconductor memory as claimed in claim 10, wherein two gate electrodes which are electrically insulated from one another are provided for the at least one rib, wherein the gate electrodes extend in the direction of the longitudinal axis of the rib and are spaced apart from the rib side faces lying opposite by second insulator layers.

12. The semiconductor memory as claimed in claim 11, wherein the gate electrodes are formed from highly doped polysilicon.

13. The semiconductor memory as claimed in claim 11, wherein a plurality of ribs which are evenly spaced apart from one another is provided, the longitudinal axes of said ribs running parallel to one another and a plurality of memory cells being formed in each of the ribs and wherein two gate electrodes which are insulated from one another are provided as word lines of the semiconductor memory for each of the ribs.

14. The semiconductor memory as claimed in claim 12, wherein a plurality of ribs which are evenly spaced apart from one another is provided, the longitudinal axes of said ribs running parallel to one another and a plurality of memory cells being formed in each of the ribs, the memory device having a plurality of gate electrodes, wherein each of the channel regions in one of the ribs is assigned precisely one of the gate electrodes which runs as a word line of the semiconductor memory perpendicularly with respect to the longitudinal axis of the ribs over a plurality of ribs.

15. The semiconductor memory as claimed in claim 13, having a plurality of bit lines running perpendicularly with respect to the word lines, each of the bit lines being electrically connected to one of the contact regions of each rib.

16. The semiconductor memory as claimed in claim 9, wherein the floating gate is one a metal and a highly doped polysilicon.

17. The semiconductor memory as claimed in claim 16, wherein a plurality of ribs which are evenly spaced apart from one another is provided, the longitudinal axes of said ribs running parallel to one another and a plurality of memory cells being formed in each of the ribs, the memory device having a plurality of gate electrodes, wherein each of the channel regions in one of the ribs is assigned precisely one of the gate electrodes which runs as a word line of the semiconductor memory perpendicularly with respect to the longitudinal axis of the ribs over a plurality of ribs.

18. The semiconductor memory as claimed in claim 16, wherein the floating gate has at least one erasure edge for injecting charge carriers from the floating gate to the gate electrode through the third insulator layer.

19. The semiconductor memory as claimed in claim 18, wherein the erasure edge of the floating gate adjoins an edge region which is formed by the first insulator layer and the third insulator layer.

* * * * *